(12) United States Patent
Staraitis et al.

(10) Patent No.: US 6,587,369 B2
(45) Date of Patent: Jul. 1, 2003

(54) TWO-STAGE MEMORY CELL

(75) Inventors: Julie M. Staraitis, Ayer, MA (US); Spencer Gold, Pepperill, MA (US); Jason Eisenberg, Mountain View, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 164 days.

(21) Appl. No.: 09/852,429

(22) Filed: May 9, 2001

(65) Prior Publication Data

US 2002/0167833 A1 Nov. 14, 2002

(51) Int. Cl.[7] ............................................. G11C 11/00
(52) U.S. Cl. ....................................... 365/154; 365/156
(58) Field of Search ................................... 365/154, 156

(56) References Cited

U.S. PATENT DOCUMENTS

| 4,175,290 A | * | 11/1979 | Harari | 327/208 |
|---|---|---|---|---|
| 4,651,303 A | * | 3/1987 | Dias et al. | 365/154 |
| 5,856,941 A | * | 1/1999 | Keyse et al. | 365/154 |
| 6,173,379 B1 | * | 1/2001 | Poplingher et al. | 711/165 |

OTHER PUBLICATIONS

U.S. patent application Ser. No. 09/852,427, Gold et al., filed May 9, 2001.

* cited by examiner

*Primary Examiner*—Huan Hoang
(74) *Attorney, Agent, or Firm*—Lahive & Cockfield, LLP

(57) ABSTRACT

A memory cell is provided to store a speculative data value until either a later speculative data value is generated or until the stored speculative data is determined to be the desired data, e.g. no longer speculative. At such time, the invention allows the stored speculative data to quickly and easily be stored as permanent data and further speculative data values to be stored.

24 Claims, 2 Drawing Sheets

TWO-STAGE MEMORY CELL

TECHNICAL FIELD

The invention relates to memory devices, specifically memory devices using an electric, electronic or electromagnetic memory cell for storing data.

BACKGROUND OF THE INVENTION

A memory cell is a unit of a memory structure capable of holding at least one bit of data. A memory cell may be formed by a wide variety of methods, such as, for example, a breadboard circuit wiring using off the shelf electronic components or semiconductor fabrication.

Memory cells are widely used in computers and other electronic processing devices for temporary storage of data. Oftentimes, memory cells will be used to repeatedly store different data values as the computer or other processing device is calculating various alternatives or seeking to obtain a solution by reviewing all possibilities. Data values determined in the course of such activities are commonly called "speculative" until the data value is determined to be the desired, final or correct result of the process. As used herein, the final data value is called a "permanent" data value. Throughout any specific series of calculations, there may be multiple segments of analysis, each ending with a permanent data value. Permanent data values are not typically stored indefinitely, and are eventually overwritten. However, permanent data values are often retained much longer than any one of the typical series of speculative data values generated during a calculation.

Storing of a permanent data value while proceeding to generate further speculative data values is typically problematic for the conventional memory cell, in which only the last data value stored within the cell can be read. A conventional memory cell can retain only one data value and therefore is unable to retain a permanent data value while simultaneously storing a new speculative data value. Therefore, conventional applications involving storage of speculative data involve an additional memory array, or multiple memory cells within a single array, to store data desired to be retained.

The use of memory cells in the handling of multiple values of speculative data has typically involved extensive hardware, because reading data from a separate array is required prior to writing the data to another array or to manage multiple memory cells for a single desired data value. Specifically, when a determination is made that the presently stored speculative data value is no longer speculative and is desired, or permanent, data, the hardware is called upon to perform multiple memory-management tasks.

SUMMARY OF THE INVENTION

According to one embodiment of the invention, a memory cell is provided having a speculative storage cell adapted to store a speculative data value, a permanent storage cell adapted to store a permanent data value and a transfer assembly, electrically coupled to the permanent storage cell and the speculative storage cell. When the transfer assembly is activated, the speculative data value is written to the permanent storage cell and stored as the permanent data value.

According to another embodiment of the invention, a memory array is provided having an array structure, including a write word line, a write bit line, a read word line and a read bit line. The memory array is also provided with a two-stage memory cell having a speculative storage cell, a permanent storage cell and a transfer assembly. The two-stage memory cell is electrically coupled to the array structure. Activation of the transfer assembly causes a speculative data value stored in the speculative storage node to be written to the permanent storage node.

According to an embodiment of the invention, the present invention simplifies the retention of desired data through the use of a single activation of a transfer line.

According to another embodiment of the invention, a method of operating a memory cell is provided, involving the steps of writing a speculative data value to a speculative storage cell and transferring the speculative data value to a permanent storage cell by a single pulse of a transfer line.

BRIEF DESCRIPTION OF THE DRAWINGS

These and other features and advantages of the present invention will be more fully understood by reference to the following detailed description in conjunction with the attached drawings.

DETAILED DESCRIPTION

Memory cells will commonly be used to repeatedly store different data values, for example, a computer or other processing device may calculate various alternatives or seek to obtain a solution by reviewing all possibilities. Data values determined in the course of such activities are commonly called "speculative" until the data value is determined to be the desired, final or correct result of the process. As used herein, the final data value is called a "permanent" data value.

Throughout any specific series of calculations, there may be multiple segments of analysis, in which one, some or all segments end with a permanent data value. Permanent data values are not typically stored indefinitely, and are eventually overwritten. However, permanent data values are often retained much longer than any one of the typical series of speculative data values generated during a calculation.

A problem in conventional memory cells involves the management of speculative data. Typically, speculative data will be stored in a memory cell, or multiple memory cells in the same or another memory array. In one conventional configuration, a single array is used and each successive iteration of speculative data is written to a memory cell. This configuration suffers from loss of any previously-written data, because each new writing overwrites previous data. Therefore, upon a determination that the stored data is the desired data, e.g. no longer speculative, extensive processing is required to manage the relevant memory cells and write the desired data to a new memory cell.

The present invention recognizes a need for simplified operation of a memory cell in the handling of speculative data. The present invention offers a two-stage memory cell with the ability to store the desired data value while simultaneously storing the latest iteration of speculative data. Upon the determination that the latest speculative data is the desired data, the speculative data can be quickly and easily stored as desired data, and the ability to store the latest iteration of speculative data resumes.

The present invention is applicable to all memory cell applications, including RAM, DRAM, SRAM, EPROM and other varieties of storage devices.

Figure 1:
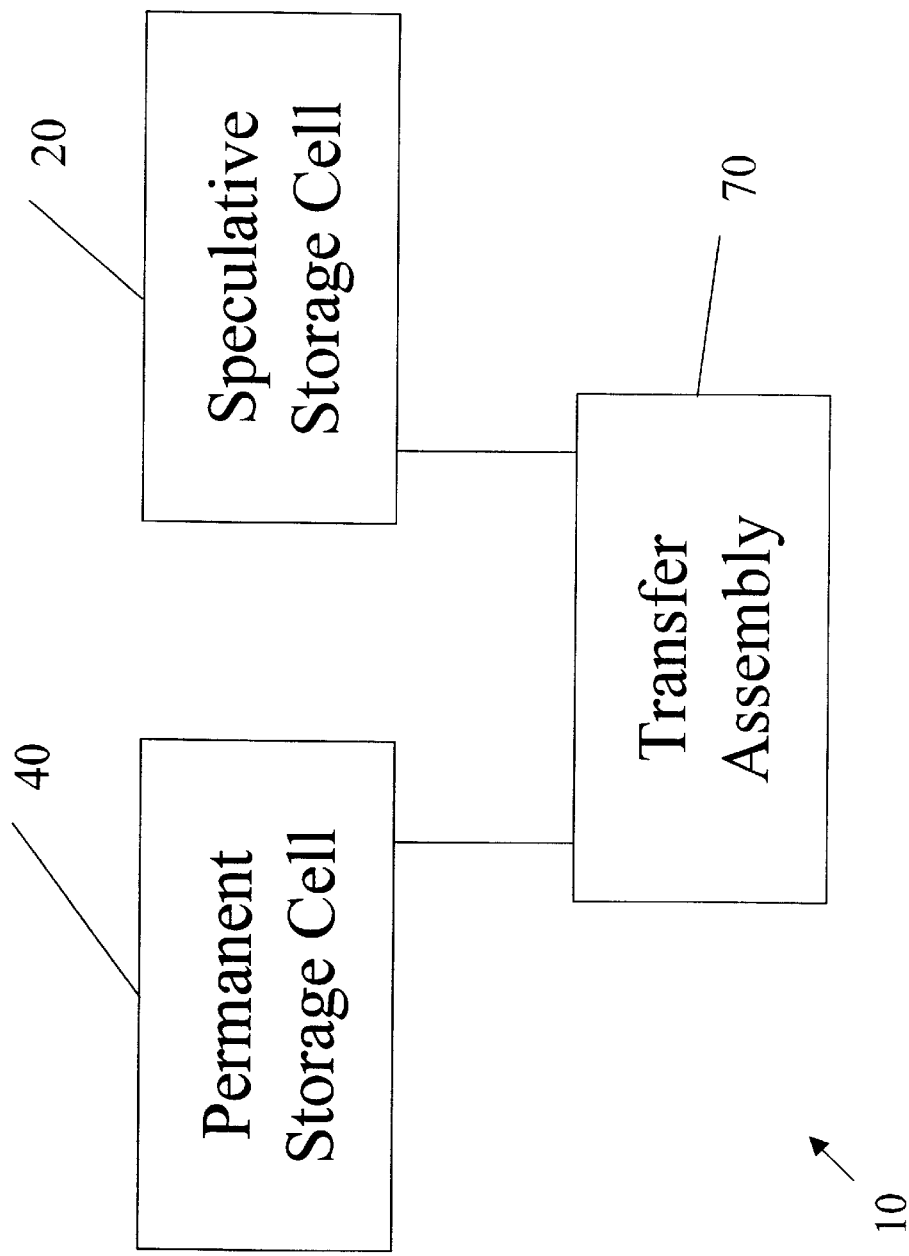
FIG. 1 is a diagram of one embodiment of the present invention.

According to one embodiment of the invention, a two-stage memory cell 10 is provided, as shown in FIG. 1. The two-stage memory cell 10 allows successive iterations of speculative data to be written to a speculative storage cell 20. Then, upon an indication that the speculative data should be permanently stored, a transfer assembly 70 writes the value of the speculative data to a permanent storage cell 40 within the memory cell 10. The transfer assembly 70 is then preferably deactivated to allow further speculative data to be written only to the speculative storage cell 20. The value held by the permanent storage cell 40 is known as permanent data.

The permanent storage cell 40 stores the permanent data, while the speculative storage cell 20 can again be written to successively until another indication that the speculative data stored by the speculative storage cell 20 should be written to the permanent storage cell 40. Both the speculative storage cell 20 and permanent storage cell 40 typically overwrite any previously stored value upon the writing of another value.

The invention is not limited to multiple writings of speculative data to speculative storage cell 20, and the invention includes only a single writing of speculative data to speculative storage cell 20.

In a preferred variation of this embodiment of the invention, the two-stage memory cell 10 is structured to prevent direct writing to permanent storage cell 40, except by the use of transfer assembly 70 in transferring the speculative data value stored in speculative storage cell 20.

Also in a preferred variation of this embodiment of the invention, the speculative data in speculative storage cell 20 can not be read directly from the speculative storage cell 20.

Figure 2:
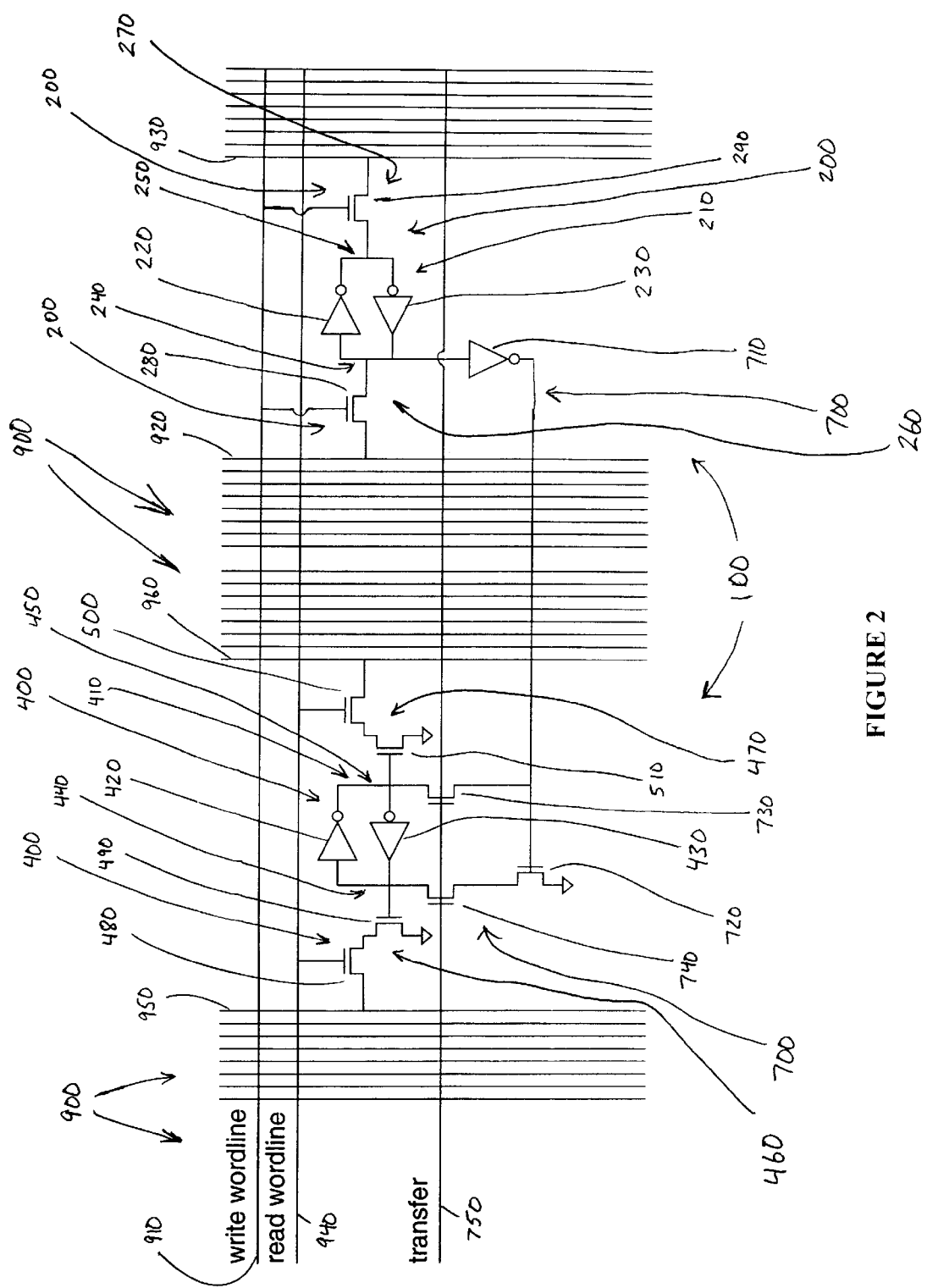
FIG. 2 is a diagram of a preferred embodiment of the present invention.

With reference to FIG. 2, a preferred embodiment of the invention will now be discussed. A two-stage memory cell 100 is provided with a speculative storage cell 200 and a permanent storage cell 400. A transfer assembly 700 is provided to selectively electrically couple the speculative storage cell 200 and permanent storage cell 400.

The speculative storage cell 200 includes a speculative storage node 210, a first write assembly 260 and a second write assembly 270. The speculative storage node 210 is preferably formed by a first speculative inverter 220 cross-coupled with a second speculative inverter 230. The speculative storage node 210 may alternatively be constructed using a variety and/or combination of other components known to one of skill in the art as capable of storing a data value. Examples of alternative components include, but are not limited to, capacitors, NAND gates and/or NOR gates. Further variations of the speculative storage node 210 include additional inverters or combinations of any of the above.

The speculative storage node 210 preferably stores a data value by maintaining an output voltage representative of the stored data value. As used herein, maintaining a voltage involves maintaining either a high or low voltage. While a voltage representing a high or low voltage may vary, the voltage remains distinguishable as either a high or low voltage. As used herein, a low voltage may include 0 volts or a negative voltage, or any voltage less than a high voltage.

The speculative storage node 210 includes a first side 240 and a second side 250. The first write assembly 260 is electrically coupled to the first side 240 of speculative storage node 210. Similarly, the second write assembly 270 is electrically coupled to the second side 250 of speculative storage node 210.

The first write assembly 260 includes a first transistor 280 configured to selectively supply a voltage to the first side 240 of speculative node 210 upon activation of external write circuitry. Similarly, the second write assembly 270 includes a second transistor 290 configured so as to selectively provide a write voltage to the second side 250 of speculative storage node 210.

When used in a memory array, the two-stage memory cell 100 will typically be electrically coupled to word lines and bit lines configured in an array structure 900, capable of individually accessing each two-stage memory cell 100 in the array. As shown in FIG. 2, the speculative storage cell 200 is electrically coupled to a write word line 910. The write word line 910 is electrically coupled to gates of both the first transistor 280 and the second transistor 290. Therefore, upon activation of the write word line 910, both the first transistor 280 and second transistor 290 are activated. The speculative storage cell 200 is also coupled to a first write bit line 920 and a second write bit line 930. The first write bit line 920 is coupled to a drain of first transistor 280. Similarly, the second write bit line 930 is coupled to a drain of second transistor 290.

In operation, the speculative data value is written to the speculative storage cell 200 by first activating write word line 910, thereby activating first transistor 280 and second transistor 290. While write word line 910 is active, one of the first or second write bit lines 920, 930 is activated. As used herein, activation of write word line 910 or first or second write bit lines 920, 930 involves raising the respective line to a high voltage, e.g. "asserting high". In the present embodiment, activation of first write bit line 920 causes a low speculative data value to be written to the speculative storage cell 200. Conversely, activation of second write bit line 930 causes a high speculative data value to be written to the speculative storage cell 200.

By way of example, if the first write bit line 920 is activated while the write word line 910 is active, e.g. having a high voltage, the high voltage of the first write bit line 920 passes through the first transistor 280 to the first side 240 of the speculative storage node 210. Simultaneously, the second side 250 of speculative storage node 210 is driven to a low voltage by activation of second transistor 290 electrically coupling the second side 250 of speculative storage node 210 to the low voltage of the second write bit line 930.

The speculative storage node 210 retains the speculative data value by the cross-coupled configuration of the first speculative inverter 220 and the second speculative inverter 230. The first and second speculative inverters 220, 230 are arranged to electrically couple the first and second side 240, 250 of the speculative storage node 210, allowing different voltages to exist on the first and second side 240, 250 of the speculative storage node 210. By the operation of the first and second speculative inverters 220, 230, the voltages at each of the first and second side 240, 250 of the speculative storage node 210 remain as high and low voltages, respectively, even after the deactivation of write word line 910 and first write bit line 920.

Alternatively, if the second write bit line 930 is activated, a high speculative data value is written to speculative storage cell 200. A high voltage passes through the second transistor 290 into the second side 250 of speculative storage node 210, while a low voltage passes through the first transistor 280 into the first side 240 of speculative storage node 210. As discussed above in relation to the writing of a low speculative data value to speculative storage cell 200, the speculative storage node 210 retains the data value written to it, even after write word line 910 and second write bit line 930 are deactivated.

The two-stage memory cell 100 is also provided with a permanent storage cell 400, as shown in FIG. 2. The permanent storage cell 400 includes a permanent storage node 410, which includes a first permanent inverter 420 and a second permanent inverter 430. A variety of alternative configurations are within the scope of the invention, as discussed above in relation to the speculative storage node 210. Similar to the speculative storage node 210, the permanent storage node 410 includes a first side 440 and a second side 450.

A first read assembly 460 is provided with a third transistor 480 and a fourth transistor 490. Third transistor 480 and fourth transistor 490 are connected in series, such that when both are activated, a path to ground is provided from a drain of the third transistor 480.

When the two-stage memory cell 100 is provided within a memory array, a read word line 940 is electrically coupled to a gate of the third transistor 480. A first read bit line 950 is electrically coupled to a drain of third transistor 480. A source of the third transistor 480 is electrically coupled to a drain of the fourth transistor 490. A gate of the fourth transistor 490 is electrically coupled to the first side 440 of the permanent storage node 410. A source of the fourth transistor 490 is grounded.

Similar to the first read assembly 460, a second read assembly 470 is provided. The second read assembly 470 includes a fifth transistor 500 and a sixth transistor 510 electrically coupled in series so as to provide, upon activation of both, path to ground from second read bit line 960. Analogous to the first read assembly 460, a gate of the fifth transistor 500 is electrically coupled to a read word line 940 and a gate of the sixth transistor 510 is electrically coupled to the second side 450 of permanent storage node 410.

A transfer assembly 700 is also provided in the two-stage memory cell 100. The transfer assembly 700 includes a transfer inverter 710 electrically coupled to the first side 240 of speculative storage node 210. The transfer inverter 710 is also electrically coupled to a gate of a transfer grounding transistor 720 and a drain of a first transfer transistor 730. A source of the first transfer transistor 730 is electrically coupled to the second side 450 of permanent storage node 410. The transfer assembly 700 also includes a second transfer transistor 740 having a source coupled to a drain of the transfer grounding transistor 720 and a drain electrically coupled to the first side 440 of permanent storage node 410. The gates of both of the first and second transfer transistors 730, 740 are electrically coupled to a transfer line 750.

When the speculative data value stored in the speculative storage cell 200 is determined to be the desired data, and therefore no longer speculative, the data value stored in the speculative storage cell 200 is transferred to the permanent storage cell 400 by activation of the transfer line 750.

By way of example, if a low data value is stored in the speculative storage cell 200, a high voltage will exist on the first side 240 of speculative storage node 210, as described above. The high voltage will pass through the transfer inverter 710 and be reduced to a low voltage. The low voltage will not activate the transfer grounding transistor 720. The low voltage will be present at the drain of the first transfer transistor 730. Because the transfer line 750 is electrically coupled to the gates of first transfer transistor 730 and second transfer transistor 740, both first and second transfer transistors 730, 740 will be activated upon activation of transfer line 750. Preferably, only a single pulse, such as a half-cycle pulse, is applied to transfer line 750. With the first transfer transistor 730 activated, the low voltage passes to the second side 450 of permanent storage node 410. The low voltage is prevented from entering the first permanent inverter 420 and instead passes into the second permanent inverter 430 because of the orientation of the first and second permanent inverters 420, 430 within the permanent storage node 410. Upon passing through the second permanent inverter 430, the voltage is changed to high voltage.

As described above in relation to the speculative storage node 210 maintaining a speculative data value, the permanent storage node 410 retains the permanent data value by the nature of the cross-coupled first and second permanent inverters 420, 430. In this example, the second side 450 of the permanent storage node 410 maintains a low voltage signal. Conversely, the first side 440 of the permanent storage node 410 maintains a high voltage signal. The second side 450 of permanent storage node 410, maintaining a low voltage signal, does not activate the gate of the sixth transistor 510. Conversely, the high voltage signal on the first side 440 of the permanent storage node 410 is sufficient to activate the gate of the fourth transistor 490.

The data value stored by the permanent storage cell 400 is preferably read by first activating the read word line 940, then sensing the data values on the first read bit line 950 and the second read bit line 960. The first read bit line 950 and the second read bit line 960 should be precharged to a high voltage prior to sensing data values thereon. The differential voltage response of first read bit line 950 and second read bit line 960 is then observed to determine the data value stored by the permanent storage cell 400.

Activation of the read word line 940 activates the third and fifth transistors 480, 500. In the present example, the fourth transistor 490 is activated and the sixth transistor 510 is off, e.g. open. Therefore, the voltage of the first read bit line 950 is taken low by a grounding path through the third and fourth transistors 480, 490. Conversely, the voltage of the second read bit line 960 remains high because no grounding path is provided by the sixth transistor 510 remaining off.

In a second example involving the preferred embodiment in which a high data value is stored in speculative storage cell 200, a low voltage is present on the first side 240 of speculative storage node 210. The transfer inverter 710 raises the low voltage to a high voltage, thereby closing the transfer grounding transistor 720.

Upon activation of the transfer line 750, as in the previous example, the first and second transfer transistors 730, 740 are activated. In this example, the high voltage is passed to the second side 450 of permanent storage node 410. The second permanent inverter 430 converts the high voltage to a low voltage value. Therefore, in contrast to the first example involving the preferred embodiment of the invention, the second side 450 of permanent storage node 410 maintains a high voltage, while the first side 440 of permanent storage 410 maintains a zero or low voltage, as a grounding path is provided by second transfer transistor 740 and transfer grounding transistor 720. Therefore, the sixth transistor 510 is activated while the fourth transistor 490 remains off. Upon reading the permanent storage cell 400, as in the first example, the read word line 940 is activated along with first and second read bit lines 950, 960. In contrast to the first example, the voltage of the second read bit line 960 is taken low by a grounding path afforded by the fifth and sixth transistors 500, 510 while the first write bit line 950 voltage remains high by the absence of a grounding path due to the fourth transistor 490 remaining off.

These examples are meant to be illustrative and not limiting. The present invention has been described by way of example, and modifications and variations of the exemplary embodiments will suggest themselves to skilled artisans in this field without departing from the spirit of the invention. Features and characteristics of the above-described embodiments may be used in combination. The preferred embodiments are merely illustrative and should not be considered restrictive in any way. The scope of the invention is to be measured by the appended claims, rather than the preceding description, and all variations and equivalents that fall within the range of the claims are intended to be embraced therein.

Having described the invention, what is claimed as new and protected by Letters Patent is:

1. A memory cell, comprising:
    a speculative storage cell adapted to store a first data value;
    a permanent storage cell adapted to store a second data value; and
    a transfer assembly, electrically coupled to said permanent storage cell and said speculative storage cell;
    wherein when said transfer assembly is activated, said first data value is written to said permanent storage cell and stored as said second data value.

2. A memory cell as defined in claim 1, wherein said speculative storage cell is comprised of two cross-coupled inverters.

3. A memory cell as defined in claim 1, wherein said permanent storage cell is comprised of two cross-coupled inverters.

4. A memory cell as defined in claim 3, wherein said speculative storage cell is comprised of two cross-coupled inverters.

5. A memory cell as defined in claim 1, wherein said speculative storage cell comprises:
    two cross-coupled inverters forming a speculative storage node having a first and second side;
    a first transistor electrically coupled to said first side of said speculative storage node; and
    a second transistor electrically coupled to said second side of said speculative storage node.

6. A memory cell as defined in claim 1, wherein said permanent storage cell comprises:
    two cross-coupled inverters forming a permanent storage node having a first and second side;
    a first read assembly including a third transistor and a fourth transistor in series, adapted to electrically couple a first read bit line to ground when a read wordline and said first side of said permanent storage node are each at a high voltage; and
    a second read assembly including a fifth transistor and a sixth transistor in series, adapted to electrically couple a second read bit line to ground when a read wordline and said second side of said permanent storage node are each at a high voltage.

7. A memory array as defined in claim 1:
    wherein said transfer assembly includes a transfer line and a single pulse to said transfer line causes said speculative data value to be written to said permanent storage cell.

8. A memory cell as defined in claim 1, wherein said transfer assembly comprises:
    a first transfer transistor having a source electrically coupled to a second side of a permanent storage node of said permanent storage cell and a drain electrically coupled to a first side of a speculative storage node of said speculative storage cell;
    a second transfer transistor having a drain electrically coupled to a first side of said permanent storage node of said permanent storage cell;
    a transfer line electrically coupled to a gate of each of said first and second transfer transistors; and
    a transfer grounding transistor having a drain electrically coupled to a source of said second transfer transistor, a gate electrically coupled to said first side of said speculative storage node of said speculative storage cell and a source electrically coupled to ground.

9. A memory cell as defined in claim 8, wherein said transfer grounding transistor is electrically coupled to said first side of said speculative storage node of said speculative storage cell by way of an inverter.

10. A memory cell for storage of a speculative data value and a permanent data value, comprising:
    a speculative storage cell adapted to store said speculative data value;
    a permanent storage cell adapted to store said permanent data value; and
    a transfer assembly, electrically coupled to said permanent storage cell and said speculative storage cell;
    wherein said transfer assembly is adapted to write said speculative data value to said permanent storage cell.

11. A memory array consisting of:
    an array structure, including a write word line, a write bit line, a read word line and a read bit line; and
    a two-stage memory cell electrically coupled to said array structure and having a speculative storage cell, a permanent storage cell and a transfer assembly;
    wherein activation of said transfer assembly causes a speculative data value stored in said speculative storage node to be written to said permanent storage node.

12. A memory array as defined in claim 11:
    wherein said write word line and write bit line are electrically coupled to said speculative storage cell; and
    wherein said read word line and read bit line are electrically coupled to said permanent storage cell.

13. A memory array as defined in claim 11, wherein said speculative storage cell is comprised of two cross-coupled inverters.

14. A memory array as defined in claim 11, wherein said permanent storage cell is comprised of two cross-coupled inverters.

15. A memory array as defined in claim 14, wherein said speculative storage cell is comprised of two cross-coupled inverters.

16. A memory array as defined in claim 11, wherein said speculative storage cell comprises:
    two cross-coupled inverters forming a speculative storage node having a first and second side;
    a first transistor electrically coupled to said first side of said speculative storage node; and
    a second transistor electrically coupled to said second side of said speculative storage node.

17. A memory array as defined in claim 11, wherein said permanent storage cell comprises:
    two cross-coupled inverters forming a permanent storage node having a first and second side;
    a first read assembly including a third transistor and a fourth transistor in series, adapted to electrically couple a first read bit line to ground when a read wordline and said first side of said permanent storage node are each at a high voltage; and a second read assembly including a fifth transistor and a sixth transistor in series, adapted to electrically couple a second read bit line to ground when a read wordline and said second side of said permanent storage node are each at a high voltage.

18. A memory array as defined in claim 11:

wherein said transfer assembly includes a transfer line and a single pulse to said transfer line causes said speculative data value to be written to said permanent storage cell.

19. A memory array as defined in claim 11, wherein said transfer assembly comprises:

a first transfer transistor having a source electrically coupled to a second side of a permanent storage node of said permanent storage cell and a drain electrically coupled to a first side of a speculative storage node of said speculative storage cell;

a second transfer transistor having a drain electrically coupled to a first side of said permanent storage node of said permanent storage cell;

a transfer line electrically coupled to a gate of each of said first and second transfer transistors; and a transfer grounding transistor having a drain electrically coupled to a source of said second transfer transistor, a gate electrically coupled to said first side of said speculative storage node of said speculative storage cell and a source electrically coupled to ground.

20. A memory array as defined in claim 19, wherein said transfer grounding transistor is electrically coupled to said first side of said speculative storage node of said speculative storage cell by way of an inverter.

21. A method of operating a memory cell, comprising the steps of writing a speculative data value to a speculative storage cell; and transferring said speculative data value to a permanent storage cell by a single pulse of a transfer line.

22. A method of operating a memory cell as defined in claim 21, further comprising the step of:

reading said permanent storage cell.

23. A memory cell, comprising:

a speculative storage cell adapted to store a speculative data value, said speculative storage cell comprising;

two cross-coupled inverters forming a speculative storage node having a first and second side;

a first transistor electrically coupled to said first side of said speculative storage node; and a second transistor electrically coupled to said second side of said speculative storage node;

a permanent storage cell adapted to store a permanent data value, said permanent storage cell comprising;

two cross-coupled inverters forming a permanent storage node having a first and second side;

a first read assembly including a third transistor and a fourth transistor in series, adapted to electrically couple a first read bit line to ground when a read wordline and said first side of said permanent storage node are each at a high voltage; and a second read assembly including a fifth transistor and a sixth transistor in series, adapted to electrically couple a second read bit line to ground when a read wordline and said second side of said permanent storage node are each at a high voltage; and a transfer assembly, electrically coupled to said permanent storage cell and said speculative storage cell, said transfer assembly comprising;

a first transfer transistor having a source electrically coupled to a second side of a permanent storage node of said permanent storage cell and a drain electrically coupled to a first side of a speculative storage node of said speculative storage cell;

a second transfer transistor having a drain electrically coupled to a first side of said permanent storage node of said permanent storage cell;

a transfer line electrically coupled to a gate of each of said first and second transfer transistors; and a transfer grounding transistor having a drain electrically coupled to a source of said second transfer transistor, a gate electrically coupled to said first side of said speculative storage node of said speculative storage cell and a source electrically coupled to ground;

wherein when said transfer assembly is activated, said speculative data value is written to said permanent storage cell and stored as said permanent data value.

24. A memory cell as defined in claim 23, wherein said transfer grounding transistor is electrically coupled to said first side of said speculative storage node of said speculative storage cell by way of an inverter.

* * * * *